TUNING FORK FREQUENCY ADJUSTER

Original Filed Jan. 19, 1961

INVENTORS
WILLIAM O. BENNETT
WILLIAM W. MUTTER
EGBERT VAN HAAFTEN
BY
ATTORNEY

United States Patent Office

Re. 26,209
Reissued May 23, 1967

26,209

TUNING FORK FREQUENCY ADJUSTER

William O. Bennett, Bayside, N.Y., and William W. Mutter, Paramus, and Egbert Van Haaften, Closter, N.J., assignors to Bulova Watch Company, Inc., New York, N.Y., a corporation of New York Original No. 3,202,848, dated Aug. 24, 1965, Ser. No. 302,955, Aug. 19, 1963, which is a division of Ser. No. 89,896, Jan. 19, 1961. Application for reissue Aug. 19, 1966, Ser. No. 582,176
7 Claims. (Cl. 310—25)

Matter enclosed in heavy brackets [ ] appears in the original patent but forms no part of this reissue specification; matter printed in italics indicates the additions made by reissue.

This invention relates generally to electronically-controlled timepieces which incorporate electromagnetically-actuated tuning forks, and more particularly to a tuning fork structure whose generating frequency may be readily and precisely adjusted. This application is a division of our copending application Serial No. 89,896, filed January 19, 1961, now abandoned.

In ordinary electric watches, make-and-break contacts are mechanically operated by the swinging of the balance wheel. Each time these contacts close, battery current flows in a coil or coils to electro-magnetically impulse the balance wheel. This mechanically operated make-and-break contact system is subject to wear and also to deterioration and contamination of the delicate contact points which must open and close an electric circuit without fail 216,000 times a day. The slightest sparking will cause rapid deterioration of these contacts and early failure of the watch.

The present invention does away with a balance wheel and escapement as well as make-and-break contacts and makes use of a timekeeping tuning fork which is pulsed electromagnetically by means of a transistor circuit. It constitutes an improvement over timepieces of the type disclosed in the copending applications Serial No. 665,480, filed June 13, 1957, entitled "Electronically-Controlled Timepiece," now Patent No. 2,971,323, issued February 14, 1961, and in Serial No. 584,709, filed May 14, 1956, entitled "Electrical Timepiece," now Patent No. 2,960,817, issued November 22, 1960.

In said copending applications there are disclosed novel timepieces including a self-sufficient timekeeping standard formed by a tuning fork having a predetermined natural frequency and a battery-energized transistorized drive circuit to sustain the vibratory motion of the fork. This motion is transferred to a rotary movement including the usual gear train and dial pointers by means of a pawl attached to one tine of the fork, the pawl advancing a ratchet wheel which drives the gear train.

While it is possible in an electronic timepiece of the above-described type, even when mass producing the device, to predetermine the operating frequency within narrow limits, it is still necessary to be able to make a final and precise adjustment of the timing frequency.

Accordingly, it is the main object of the invention to provide a tuning fork structure whose operating frequency may be readily and precisely adjusted. More specifically, it is an object of the invention to provide a frequency regulator which may be clipped onto the transducers attached to the tines of the fork.

For a better understanding of the invention as well as other objects and further features thereof, reference is made to the following detailed description to be read in conjunction with the accompanying drawings wherein like components in the several figures are identified by like reference numerals.

Figure 1:
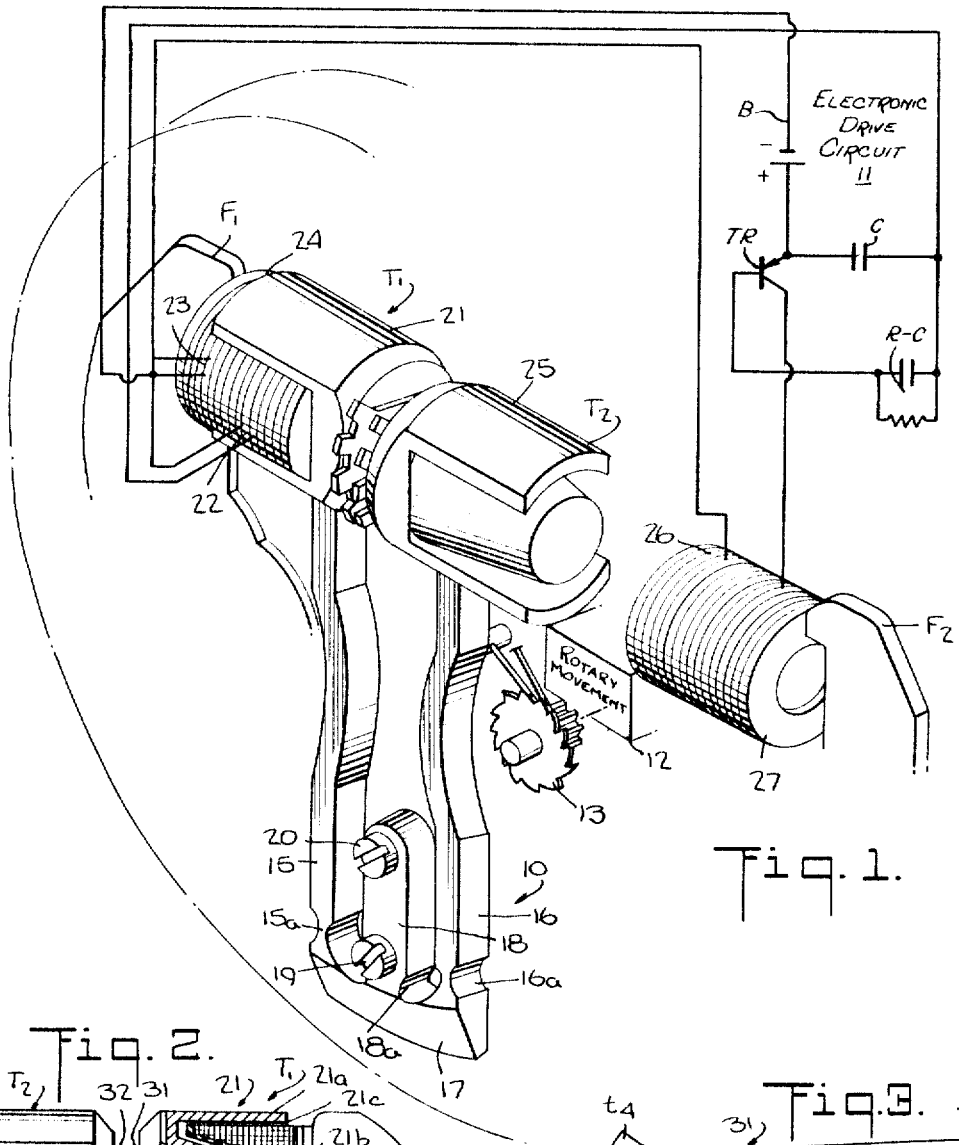
FIG. 1 is a schematic representation, in perspective, of the basic components of an electronic timepiece in accordance with the invention.
Figure 2:
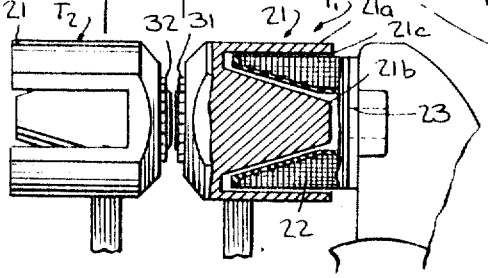
FIG. 2 is a separate elevational view of the tuning fork structure showing the clipped-on regulators.

Referring now to the drawings and more particularly to FIG. 1, the major components of a timepiece in accordance with the invention are a timekeeping standard constituted by a tuning fork 10 and an electronic drive circuit 11 therefor, a rotary movement of conventional design including a gear train 12 for turning the hands of the timepiece, and a motion transformer including an index wheel 13 operatively intercoupling the fork 10 and the rotary movement 12 and acting to convert the vibratory action of the fork into rotary motion. The tuning fork has no pivots or bearings and its timekeeping action is therefore independent of the effects of friction.

All of the electrical components of the drive circuit are mounted on two unitized sub-assembly units or modules $F_1$ and $F_2$ attached to a disc-shaped metallic pillar plate 14 which may be supported within a watch casing of standard design or within any other type of housing, depending on the use to which the timepiece is put. The electrical components are constituted by a transistor TR, a battery B, a bias circuit R-C, and a capacitor C.

Tuning fork 10 is provided with a pair of flexible tines 15 and 16 interconnected by a relatively inflexible base 17, the base being provided with an upwardly extending stem 18 secured to the pillar plate by suitable screws 19 and 20. The central area of the pillar plate is cut out to permit unobstructed vibration of the tines.

The tuning fork is actuated by means of a first transducer $T_1$ constituted by a magnetic element 21 secured to the free end of tine 15, the element coacting with a drive coil 22, and a phase sensing coil 23. Drive coil 22 is wound on an open ended tubular carrier 24 affixed to a sub-assembly mounting form $F_1$ which is secured to pillar plate 14. Coils 22 and 23 may be wound in juxtaposed relation on carrier 24 or the phase sensing coil 23 may be wound over drive coil 22.

A second transducer $T_2$ is provided constituted by a megnetic element 25 secured to the free end of tine 16 and coacting with a drive coil 26 wound on a tubular carrier 27.

As is well known, the tines of a vibrating fork normally oscillate toward and away from each other. That is, inward movement of one tine from its normal rest position is accompanied by a corresponding inward movement of the other tine and outward movement of one tine is accompanied by a corresponding outward movement of the other tine.

Although it is possible to manufacture tuning forks with a very small margin of error, in large scale production techniques it is still necessary as a practical matter to effect a final factory adjustment. Also adjustments are required to take care of differences arising from the personal habits of a wearer. In the present instance, the frequency of the fork is determined not by the fork per se but by the combined mass of the tines and their associated magnetic elements and to effect matching of the tines it is necessary that symmetry exist as between the centers of gravity of the two oscillating masses with respect to the axis of symmetry of the fork. Also with aging of the fork over a period of years, a further slight adjustment may be necessary if one wishes to maintain the accuracy of the timepiece within a few seconds a week.

Figure 3:
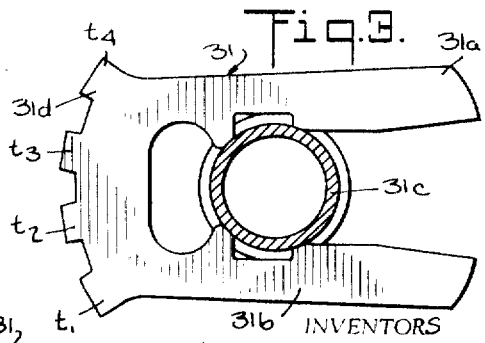
FIG. 3 is a separate plan view of the timing regulator.
Figure 4:
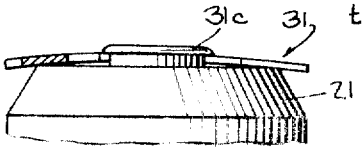
FIG. 4 is a side view of the regulator attached to the cup of the magnetic element.

For the purpose of effecting a fine adjustment in operating frequency of each tine, there are attached to the magnetic elements 21 and 25, identical regulator devices 31 and 32, respectively. As shown separately in FIGS. 3 and 4, regulator 31 is constituted by a flat metal clip preferably made of beryllium copper alloy and having a pair of spring fingers 31*a* and 31*b* which clamp about a rivet 31c inserted centrally at the end of the associated magnetic cup, the clip lying against the base of the cup. The spring fingers project from a bridge 31d whose arcuate upper edge is serrated to define a series of spaced teeth $t_1$, $t_2$, $t_3$, etc. By the use of a simple tool adapted to engage the teeth, the clip may be turned in either direction relative to the axis of the rivet to effect an angular displacement of the teeth.

The regulator clip in combination with its associated magnetic element constitutes a mass which loads the tine to which they are attached. The frequency of a tuning fork is dependent upon the "effective" length of the tines. Moving the regulators upward, away from the base of the fork, will effectively lengthen the tine by moving its center of gravity. This will cause a slower rate. Conversely, moving a regulator down, toward the base of the fork, will cause a faster rate.

Each tooth $t_1$, etc., constitutes a minute component of the total mass, and as the clip is rotated, the resultant displacement in the center of gravity produces a fine change in the operating ferquency. In practice, the clip may be designed so that an angular displacement of the clip corresponding to one tooth or groove between causes a two second per day variation in the operating rate of the timepiece. Corrections as small as ½ second a day can be easily made by moving the regulator one quarter of a division. Because of the basic accuracy of a tuning fork, corrections greater than a few seconds per day are not required. In fact, the total range in the regulator system shown is only 28 seconds per day.

While there has been shown what is considered to be a preferred embodiment of the invention, it will be obvious that many changes may be made therein without departing from the essential spirit of the invention as defined in the annexed claims.

What is claimed is:

1. An electromagnetically-actuated vibrator comprising a tuning fork having a pair of tines, and means for actuating said fork including a transducer constituted by a magnetic element attached to one of said tines and formed by a cylindrical cup having a magnetic rod supported coaxially therein, a frequency regulator for said tine constituted by a spring clip having a pair of fingers clamping a rivet attached to the base of said cup and pivotable thereon, said clip having a toothed bridge portion which when angularly displaced effectively shifts the center of gravity of said element.

2. A vibrator, as set forth in claim 1, wherein each of said tines is provided with said element and said regulator thereon to effect matching of said tines as well as frequency control.

*3. A calibrated adjustment means for finely regulating the frequency of an electronically-controlled timepiece of the type having an electromagnetically-actuated tuning fork vibrator comprising, a small unbalanced loading mass pivotally secured to and near the free end of one of the tines of said tuning fork, whereby rotational displacement of said loading mass about its pivot serves to shift the center of gravity of said tine, and calibrated indicia cooperating with said loading mass for indicating the amount of rotational displacement accorded said loading mass relative to said tine, whereby the angular positioning of said loading mass relative to said tine as defined by the markings on said indicia provides a calibrated means for altering the operating frequency of said tuning fork in small predetermined amounts.*

*4. The calibrated adjustment means set forth in claim 3 characterized in that the range of fine frequency regulation provided by said means enables predetermined timepiece corrections at least as small as one second a day, faster or slower, to be readily and accurately made.*

*5. The calibrated adjustment means set forth in claim 3 further characterized in that both of the tines which comprise said tuning fork contain thereon a respective loading mass with associated calibrated indicia, whereby the center of gravity of each of said tines may be independently shifted in small predetermined amounts by rotational displacement of its corresponding loading mass.*

*6. The calibrated adjustment means set forth in claim 3 further characterized in that rotational displacement of the center of gravity of said unbalanced loading mass in a direction away from the stem of said tuning fork vibrator decreases the operating frequency thereof, whereas rotational displacement toward said stem increases the frequency of said vibrator.*

*7. A calibrated adjustment means for finely regulating the frequency of a tuning fork (10) having a pair of vibrating tines (15, 16) comprising, respective small loading masses (31, 32) eccentrically supported and pivotally secured to and near the free end of each of said tines of said tuning fork, whereby rotational displacement of a respective loading mass about its pivot serves to shift the center of gravity of its corresponding tine, and spaced indicia ($t_1$, $t_2$, $t_3$, $t_4$) associated with each of said respective loading masses for indicating the amount of rotational displacement afforded said respective loading masses relative to its corresponding tine, whereby the angular positioning of said respective loading mass relative to its tine, as defined by said associated indicia, provides a calibrated means for altering the operating frequency of said tuning fork in small predetermined amounts.*

References Cited by the Examiner

The following references, cited by the Examiner, are of record in the patented file of this patent or the original patent.

UNITED STATES PATENTS

| | | | |
|---|---|---|---|
| 2,015,410 | 9/1935 | Prescott | 84—409 |
| 2,469,951 | 5/1949 | Cooley | 84—457 |
| 2,928,308 | 3/1960 | Godbey | 84—409 X |
| 2,946,218 | 7/1960 | Karpchuk | 73—70.2 |
| 3,070,951 | 1/1963 | Hetzel | 84—457 |

MILTON O. HIRSHFIELD, *Primary Examiner.*

D. F. DUGGAN, *Assistant Examiner.*